United States Patent [19]
Taylor et al.

[11] Patent Number: 5,539,272
[45] Date of Patent: Jul. 23, 1996

[54] ROTATING FLOATING MAGNETRON DARK-SPACE SHIELD

[75] Inventors: Clifford L. Taylor, Nerstrand; Daniel T. Crowley, Owatonna, both of Minn.

[73] Assignee: Viratec Thin Films, Inc., Faribault, Minn.

[21] Appl. No.: 541,399

[22] Filed: Oct. 10, 1995

Related U.S. Application Data

[63] Continuation of Ser. No. 174,533, Dec. 30, 1993, abandoned.

[51] Int. Cl.⁶ .............................. H01J 21/22; C23C 15/00
[52] U.S. Cl. .................... 313/149; 313/148; 315/39.51; 315/39.63; 315/39.67; 204/298.23; 204/298.22
[58] Field of Search .................................. 313/149, 148, 313/231.31, 231.41; 315/39.51, 39.67, 39.63; 204/298.23, 192.22, 192.12, 298.22, 298.24

[56] References Cited

U.S. PATENT DOCUMENTS

| | | | |
|---|---|---|---|
| 4,356,073 | 10/1982 | McKelvey | 204/298.22 X |
| 4,362,611 | 12/1982 | Logan et al. | 204/192.22 X |
| 4,407,713 | 10/1983 | Zega | 204/298.22 |
| 4,422,916 | 12/1983 | McKelvey | 204/298.22 X |
| 4,443,318 | 4/1984 | McKelvey | 204/298.22 X |
| 4,445,997 | 5/1984 | McKelvey | 204/298.22 X |
| 4,466,877 | 8/1984 | McKelvey | 204/298.22 X |
| 5,100,527 | 3/1992 | Stevenson et al. | 204/298.22 X |
| 5,200,049 | 4/1993 | Stevenson et al. | 204/298.22 |
| 5,213,672 | 5/1993 | Hartig et al. | 204/298.22 |

OTHER PUBLICATIONS

M. Wright et al., "Design advances and applications of the rotatable cyllindrical magnetron," *Journal of Vacuum Science and Technology A*, vol. 4, No. 3, May/Jun. 1986, pp. 388–392.

*Primary Examiner*—Sandra L. O'Shea
*Assistant Examiner*—Ashok Patel
*Attorney, Agent, or Firm*—Fish & Richardson

[57] ABSTRACT

A rotatable magnetron cathode having at least one supported end adapted for attachment to a spindle. At least one dark space shield is attached to the cathode at a supported end to rotate therewith, and is electrically floating relative to the cathode.

22 Claims, 5 Drawing Sheets

ROTATING FLOATING MAGNETRON DARK-SPACE SHIELD

This is a continuation of application Ser. No. 08/174,533, filed Dec. 30, 1993, now abandoned.

BACKGROUND OF THE INVENTION

The present invention relates generally to magnetron sputtering apparatus, and more particularly to rotating magnetrons.

DC reactive sputtering is the deposition process most often used for large area commercial coating applications, such as the application of thermal control coatings to architectural and automobile glazing. In this process, the articles to be coated are passed through a series of in-line vacuum chambers isolated from one another by vacuum locks. This system may be referred to as a continuous in-line system or a glass coater.

Inside the vacuum chambers, a sputtering gas discharge is maintained at a partial vacuum at a pressure of about 3 millitorr. The sputtering gas comprises a mixture of an inert gas, such as argon, with a small proportion of a reactive gas, such as oxygen, for the formation of oxides.

Each chamber contains one or more cathodes held at a negative potential of about −200 to −1000 volts. A layer of material to be sputtered is applied to the cathode surface. This surface layer is known as the target or the target material. The reactive gas forms the appropriate compound with the target material.

Ions from the sputtering gas discharge are accelerated into the target and dislodge, or sputter off, atoms of the target material. These atoms, in turn, are deposited on a substrate, such as a glass sheet, passing beneath the target. The atoms react on the substrate with the reactive gas in the sputtering gas discharge to form a thin film. It is advantageous to produce the gas discharge in the presence of a magnetic field using an apparatus known as a magnetron. An array of magnets is mounted in a fixed position behind the target. The magnetic field causes electrons from the discharge to be trapped in the field and travel in a spiral pattern, which creates a more intense ionization and higher sputtering rates. Appropriate water cooling is provided to prevent overheating of the target.

The architectural glass coating process was made commercially feasible by the development of the magnetically-enhanced planar magnetron. A disadvantage of the planar magnetron is that the target material is only sputtered in the narrow zone defined by the magnetic field. This creates a "racetrack"-shaped sputtering zone on the target. Thus, a "racetrack"-shaped erosion zone is produced as sputtering occurs. This causes a number of problems. For example, localized high temperature build-up eventually limits the power at which the cathodes can operate, and only about 25 percent of the target material is actually used before the target must be replaced.

The rotary or rotating magnetron was developed to overcome some of the problems inherent in the planar magnetron. The rotating magnetron uses a substantially cylindrical cathode and target. The cathode and target are rotated continually over a magnetic array which defines the sputtering zone. As such, a new portion of the target is continually presented to the sputtering zone which eases the cooling problem, allowing higher operating powers. The rotation of the target also ensures that the erosion zone comprises the entire circumference of the cathode covered by the sputtering zone. This increases target utilization. The rotating magnetron is described further in U.S. Pat. Nos. 4,356,073 and 4,422,916, the entire disclosures of which are hereby incorporated by reference.

The rotating magnetron requires bearings to permit rotation, and vacuum seals for the drive shaft, the electrical conduits and the cooling conduits. Vacuum and rotary water seals have been used to seal around the drive shaft and the conduits which extend between the coating chamber and the ambient environment. However, such seals have a tendency to develop leaks under conditions of high temperature and high mechanical loading. Various mounting, sealing and driving arrangements are described in U.S. Pat. Nos. 4,443,318; 4,445,997; and 4,466,877, the entire disclosures of which are also hereby incorporated by reference. These patents describe rotating magnetrons mounted horizontally in a coating chamber and supported at both ends. In this arrangement, two spindles, one of which is a drive shaft and the other an idler, are attached to the ends of the cathode.

It is often preferable, however, to support the magnetron at only one end designated as the drive end by a cantilever mount. The other end of the cathode may be referred to as the free end. The cantilever mounting arrangement produces the highest bearing loads. Several examples of cantilever mounted rotary magnetrons are given in *Design Advances and Applications of the Rotatable Magnetron*, Proceedings of the 32nd National Symposium of the American Vacuum Society, Vol. 4, No. 3, Part 1, pages 388–392 (1986), the entire text of which is hereby incorporated by reference. A cantilever mounted magnetron usually includes a bearing housing containing a drive shaft, a rotary vacuum seal, and at least two bearings spaced along the drive shaft, one of which may function as a shaft seal.

A rotating magnetron incorporating a cantilever mounted removable cathode and having low vacuum seal loads is described in U.S. Pat. Nos. 5,100,527 and 5,200,049, both assigned to the owner of the subject application, the entire disclosures of which are hereby incorporated by reference. Such a system allows, among other things, the cathode to be removed easily and without special equipment, thus reducing system down time both by reducing the time required to replace a cathode and by making simultaneous removal of two or more cathodes practical.

In general, a dark space shield or sleeve may be concentrically disposed about the cathode body and spaced from its surface to form a gap. The distance across this gap is less than the dark space length. The dark space is the region of gas discharge next to the cathode. Here, the electrons accelerate under an applied operating voltage to become adequately energized to cause ionization of the sputtering gas. The dark space length is a function of the type of sputtering gas, the gas pressure and the applied electric field. The dark space length, for example, may be on the order of three millimeters.

The dark space shield protects the cathode body from the gas discharge and resultant ion bombardment. Dark space shields are usually provided at both the drive end and the free end of the cathode. The shield around the drive end of the cathode body should prevent the sputtering gas discharge from contacting that end. The dark space shield has a provision such a flange, for attachment to an appropriate mounting surface. For the dark space shields used heretofore at the supported end or ends of the cathode, the mounting surface has been the chamber wall or a flange attached to the chamber wall, such that the dark space shield does not rotate with the cathode. The shield is also electrically insulated from this mounting surface so that it is electrically isolated therefrom. Thus, it floats electrically and acquires an electrical potential of the gas discharge. A preferred material for the shield is stainless steel.

During sputtering, a film of deposited material grows on the dark space shield, usually under tensile or compressive stress. The stress is highest on sharp edges. Eventually the film deposited begins to spall off, beginning usually on such sharp edges and on areas where the film is thickest. If the resulting flakes of material fall onto a substrate, they obstruct deposition on the areas of the substrate that they cover, resulting in defective products. In order to minimize the rate of film growth on a given dark space shield surface, that surface should point in a direction as close as possible to the direction away from the sputtering target.

The spacing between the dark space shield and the cathode must be well controlled to be less than a dark space length and to ensure that the shield does not touch the cathode. In the rotating magnetron systems known heretofore, the imprecision in the positioning of the dark space shield around a supported end of the cathode can arise from four different sources. These sources are the imprecision in the positioning of the shield with respect to its mounting surface of the chamber wall, the imprecision in the positioning of the bearing housing relative to the chamber wall, the imprecision in the positioning of the spindle relative to the bearing housing, and the imprecision in the positioning of the cathode relative to the spindle.

Accordingly, an object of the present invention is to provide a dark space shield for a supported end of a rotatable cathode wherein the imprecision in the shield to cathode spacing is reduced.

Another object of the present invention is to provide a dark space shield wherein the tendency of the growing film to spall off the shield is reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a shielded rotatable magnetron cathode comprising a rotatable magnetron cathode having at least one flanged supported end adapted for attachment to a spindle. A dark space shield is attached to the cathode at a supported end thereof, such that it rotates with the cathode but is electrically floating relative to it. The shield has a base facing the flange at the end of the cathode to which it is attached. In order to reduce the tendency of deposited material to spall off the shield, it is advantageous for the shield to have a generally triangular cross section near its base. Such a shield can be used for a cantilever mounted cathode at the drive end of the cathode. The shield can also be used for either end, or both, of a cathode supported at both ends. The cathode can be mounted horizontally, vertically, or at any other angle.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

DESCRIPTION OF THE PREFERRED EMBODIMENT

Figure 1:
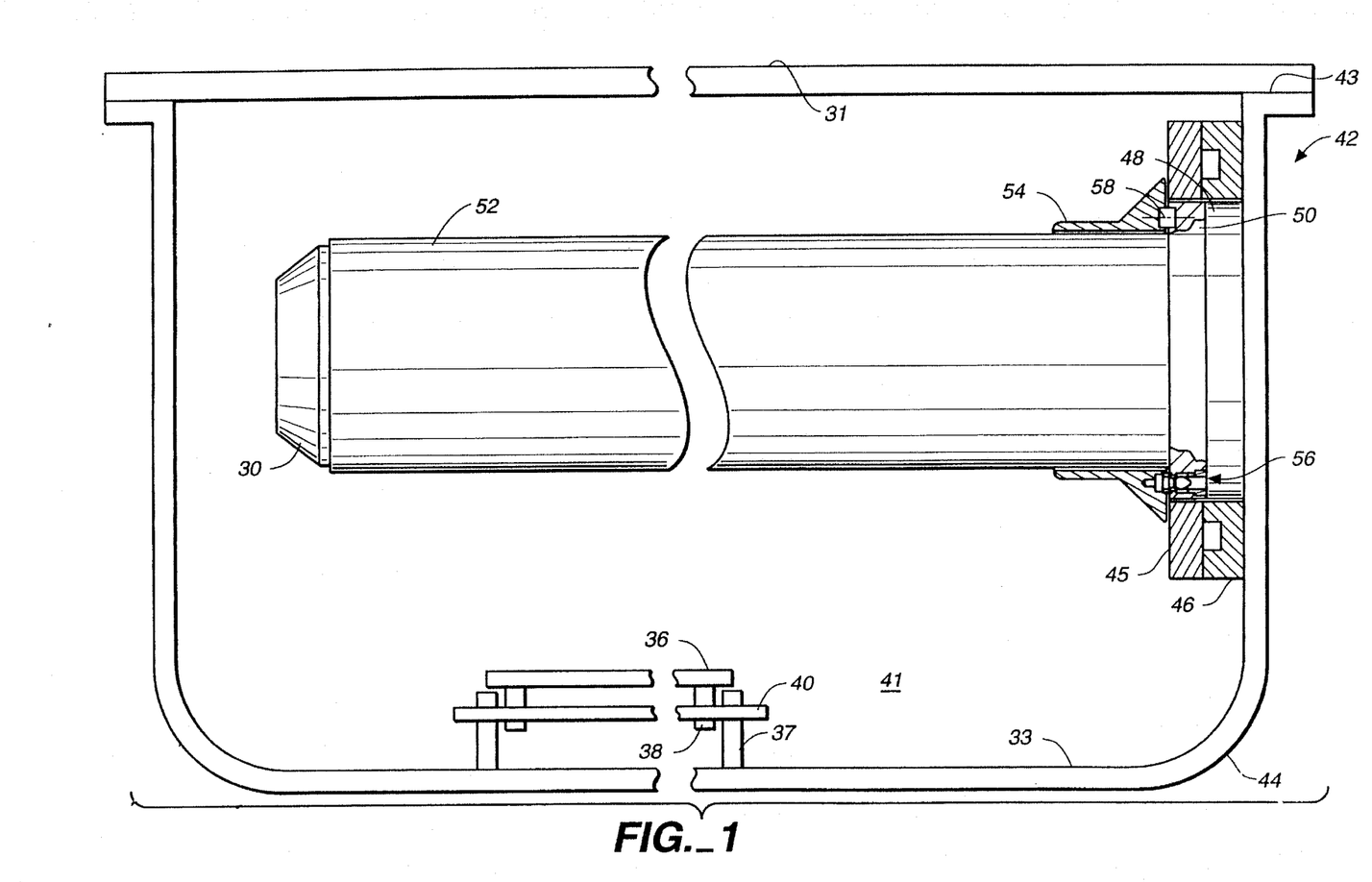
FIG. 1 is a partial cross-sectional and elevational view of a sputtering chamber utilizing a supported end dark space shield according to the present invention on the drive end of a cantilever mounted cathode.

The present invention will be described in terms of the preferred embodiment. The preferred embodiment is a rotatable magnetron cathode with a dark space shield attached at a supported end of the cathode. The cathode is cantilever mounted, and the dark space shield is attached at the cathode's drive end to rotate therewith. As shown in FIG. 1, the rotatable magnetron apparatus 42 may comprise a cantilever-mounted tubular cathode 52 in a sputtering or coating chamber 41. The coating chamber may be bounded by walls 44 and sealed by a cover 31 that abuts against a flange 43.

A substrate 36 to be coated may be transported through coating chamber 41 on rollers 38 mounted on a spindle 40. The spindle may be supported on bearings 37 attached to a floor 33 of the sputtering chamber.

Cathode 52 has a flange 50 attached to a flange 48 of a drive shaft 68 (see also FIGS. 2 and 3) used to rotate the cathode. The cathode can be removed while leaving the drive shaft in place by disconnecting flange 50 from flange 48.

Flanges 48 and 50 are surrounded by stationary water ring 46 which is water cooled and electrically grounded. The free end of cathode 52 includes a dark space shield 30. The present invention provides for a rotating dark space shield 54 at the drive end of the cathode, which is attached to and rotates with the cathode. Dark space shield 54 may be attached to cathode flange 50 using, for example, three lock pin and socket assemblies 56 positioned 120° apart from each other. Stand-off insulators 58 maintain a minimum spacing between shield 54 and cathode flange 50 and may be positioned diametrically opposite lock pin and socket assemblies 56.

Figure 2:
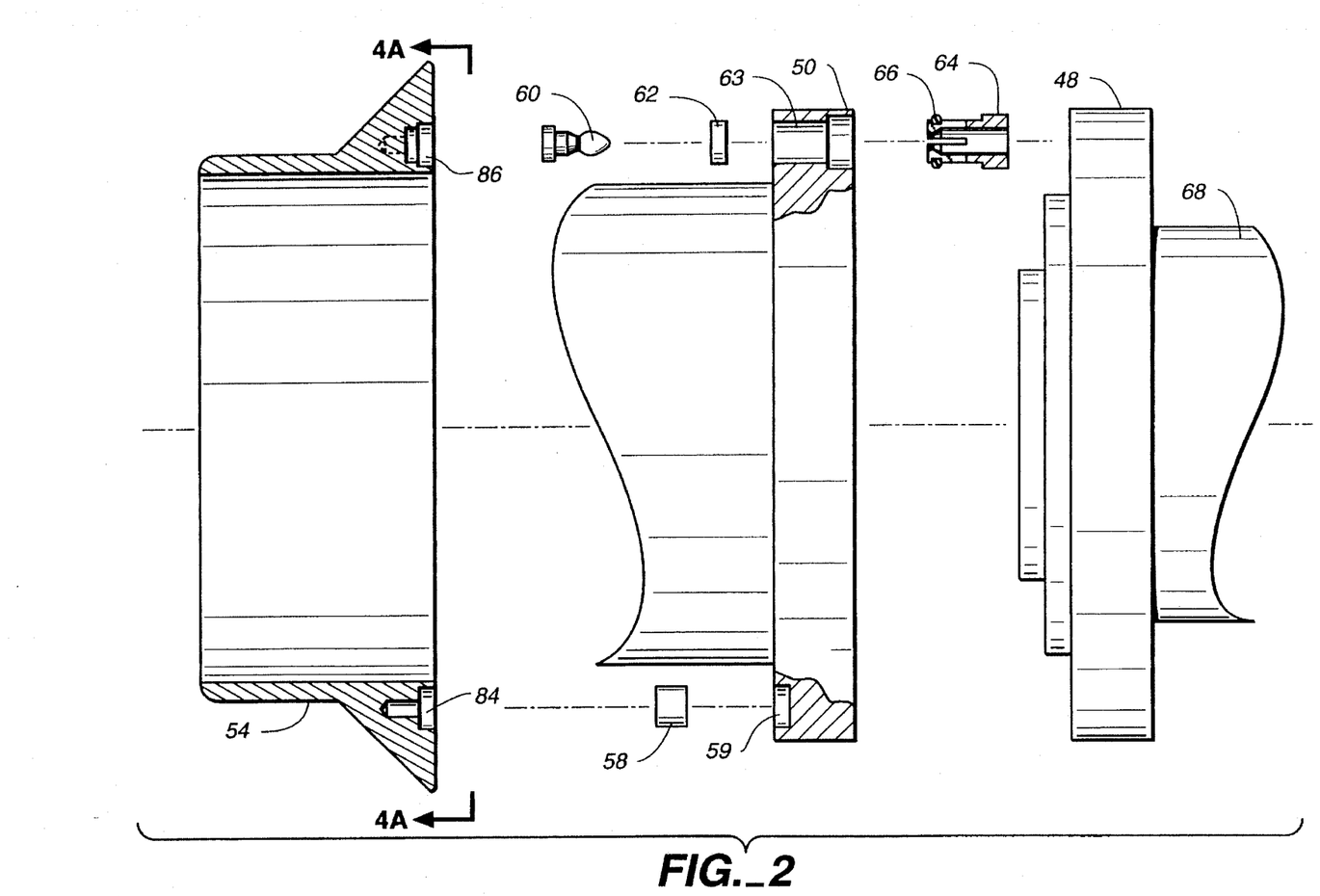
FIG. 2 is a partial cross-sectional exploded and enlarged view of the dark space shield assembly of FIG. 1.
Figure 5A:
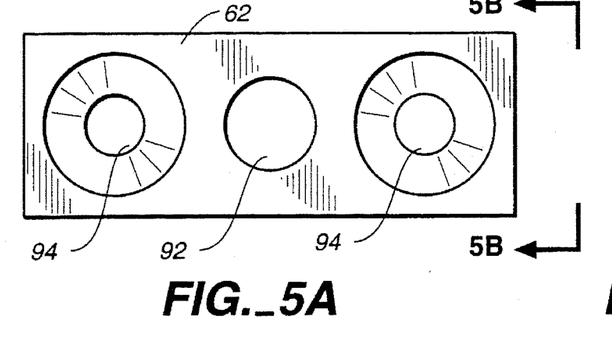
FIG. 5A is an enlarged view, along the longitudinal axis of the cathode, of the pin retainer shown in FIG. 2.
Figure 5B:
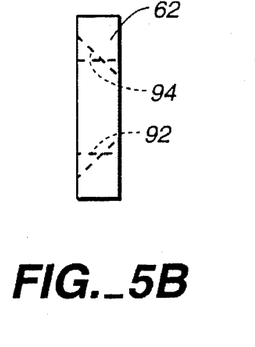
FIG. 5B is an elevational view of the pin retainer along line 5B—5B of FIG. 5A.

FIG. 2 is an exploded view of the arrangement used to attach dark space shield 54 to cathode flange 50. Sockets 64 and o-rings 66 are inserted into a recess 63 of cathode flange 50 before mounting the cathode to drive shaft flange 48, by, for example, bolting it to the drive shaft flange. O-rings 66 resist deformation of sockets 64 thus improving lock pin retention. Lock pins 60 are secured to shield 54 using retainers 62 (see FIGS. 5A and 5B). After stand-off electrical insulators 58 are inserted into recesses 59 and 84 in cathode flange 50 and dark space shield 54, respectively, the shield is attached to flange 50 by inserting pins 60 into sockets 64.

Figure 3:
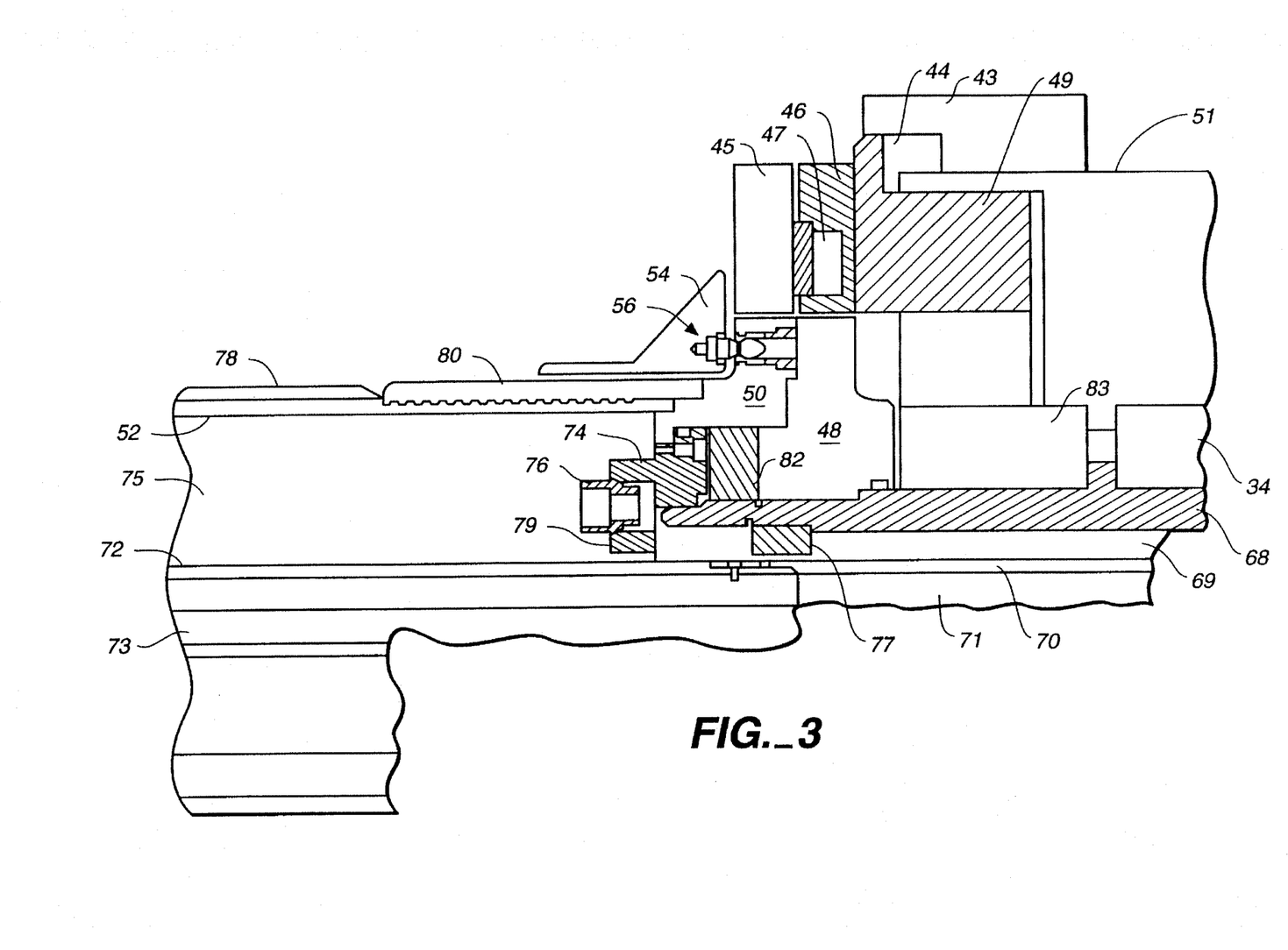
FIG. 3 is a cross-sectional view of a cantilever-mounted cathode, its drive end dark space shield, drive shaft and bearing housing according to the present invention. Only the upper half of the drive end of the cathode, drive shaft and bearing housing is shown. The lower half is symmetrical with the upper half.

FIG. 3 is a more detailed cross-sectional view of the arrangement used to rotate, cool and shield the cathode. Only the upper half of the drive end of the cathode, drive shaft and bearing housing is shown. The lower half is symmetrical with the upper half. The entire cathode, drive shaft and bearing housing assemblies are supported by flange 49 welded to chamber wall 44. Bearing housing 51 is mounted on the exterior side of flange 49 relative to coating chamber 41. Water ring 46 with cooling channel 47 is mounted on the interior side of flange 49 relative to coating chamber 41. Water ring 46 is covered by a cleanable aluminum cover 45. A hollow drive shaft 68 is held within bearing housing 51 by bearing 34 and is sealed against the bearing housing by a rotary seal 83. Preferably, seal 84 is a ferrofluidic seal. As is known, a ferrofluidic seal incorporates a colloidal suspension of ultramicroscopic magnetic particles in a carrier liquid. Drive shaft 68 is rotated relative to bearing housing 51 by a motor (not shown). Drive shaft flange 48 is secured to drive shaft 68 by nut 82. Concentric with and inside drive shaft 68 is cooling fluid transport tube 70 which, together with the drive shaft, defines inner and outer cooling fluid conduits 71 and 69, respectively. Fluid transport tube 70 does not rotate with drive shaft 68 but is held concentric with drive shaft 68 by centering ring 77.

The demountable cathode 52 and dark space shield 54, whose combination is bolted to drive shaft flange 48 as described above, are next described with reference to FIG. 3. Cylindrical cathode 52 is covered over most of its length by a target material 78. At the ends of the cylindrical sputtering zone (only the drive end is shown), the cathode is preferably covered with a collar 80 of a material such as titanium to reduce arcing and increase maximum power as described in co-pending U.S. patent application Ser. No. 08/016,492, now abandoned, assigned to the owner of the subject application, the entire disclosure of which is hereby incorporated by reference. The collars may also extend target life by reducing erosion at the plasma "racetrack"-turnarounds where the power density is greatest.

Cathode 52 has, at its drive end, cathode mounting flange 50 for attachment to drive shaft flange 48. The tubular body of the cathode is attached to flange 50 by welding or bolting. A check valve 76 for stopping the flow of coolant when the cathode is removed is mounted on a flange 74. Rotatably supported inside a bushing 79 and concentric with cathode 52 is fluid transport tube 72, which, together with cathode 52, defines inner and outer cooling fluid conduits 73 and 75, respectively. When the cathode is mounted on the drive shaft, check valve mounting flange 74 seals against drive shaft 68 and cooling fluid transport tube 70 seals against fluid transport tube 72. As a result, cathode conduits 73 and 75 communicate with the corresponding conduits 71 and 69 inside the drive shaft. Dark space shield 54 is attached to cathode mounting flange 50 as discussed above, using lock pin and socket assemblies 56.

Figure 4A:
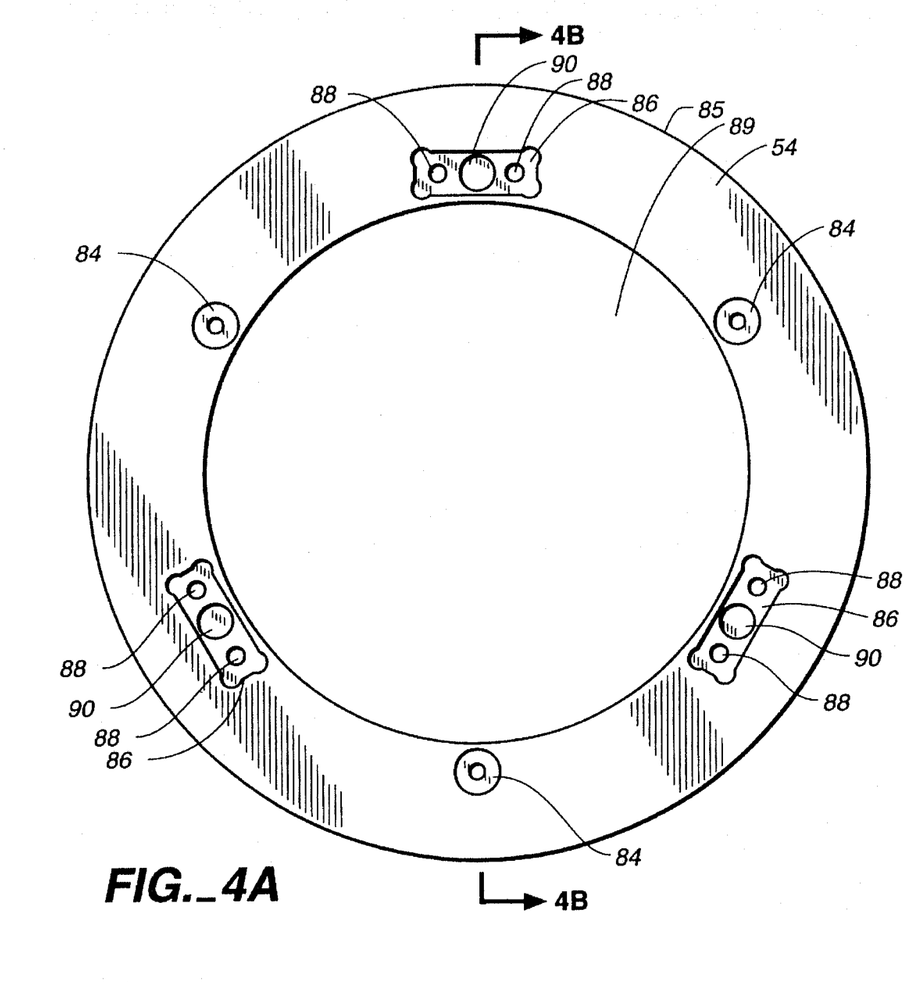
FIG. 4A is a view of the dark space shield of the present invention along line 4A—4A of FIG. 2.
Figure 4B:
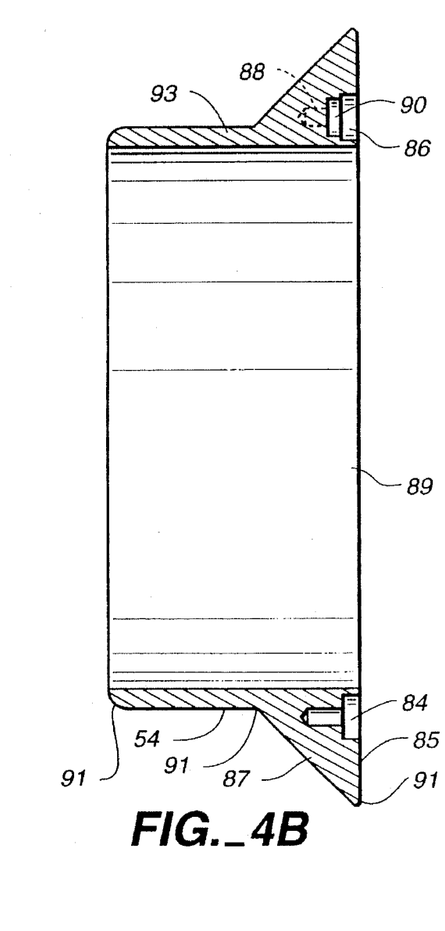
FIG. 4B is a cross sectional view of the dark space shield along line 4B—4B of FIG. 4A.

As shown in FIGS. 4A–B dark space shield 54 has an opening 89 whose diameter is sufficient to accommodate the tubular portion of cathode 52 with a clearance equal to the dark space length. The shield has a base 85 facing cathode flange 50 at the drive end of the cathode when mounted. In order to reduce the tendency of deposited material to spall off the shield, it is advantageous for the shield to have a section 87 of generally-triangular cross-section near its base, and rounded edges 91. That part 93 of the dark space shield extending away from the base toward the free end of the cathode may be generally cylindrical. Three recesses 84 are provided in the base 85 of the shield for stand-off insulators 58, shown in FIG. 2. Three rectangular recesses 86 are also provided in the base for pin retainers 62. Three recesses 90 are provided, inside recesses 86, for bases 96 of lock pins 60 (see FIGS. 2B and 6A). Also inside each recess 86, on either side of recess 90, are provided two threaded holes 88. These holes and two matching tapered holes 94 in pin retainer 62 (see FIGS. 5A–5B) are used for bolting the pin retainers into recesses 86. Each lock pin 60 passes through hole 92 of its retainer and is held with its base 96 captive between dark space shield 54 and a retainer 62, in a recess 90 of the shield.

Figure 6A:
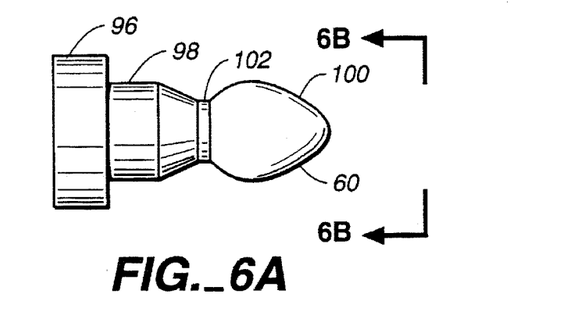
FIG. 6A is an enlarged view of the lock pin shown in FIG. 2.
Figure 6B:
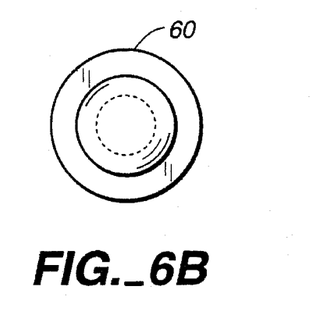
FIG. 6B is an end view of the lock pin along line 6B—6B of FIG. 6A.

As shown in FIGS. 6A and 6B, lock pins 60 have a body member 98 with a tapered end 100 to facilitate insertion into a socket 64.

Figure 7A:
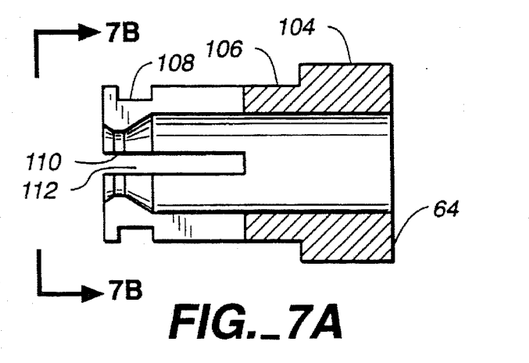
FIG. 7A is an enlarged view of the socket shown in FIG. 2.
Figure 7B:
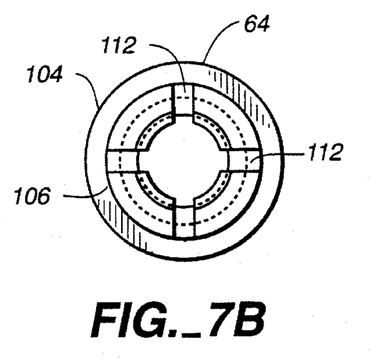
FIG. 7B is an end view of the socket along line 7B—7B of FIG. 7A.

Each lock pin 60 also has a neck 102 which, when the dark space shield is mounted, is engaged by a matching bore 110 of socket 64, as shown in detail in FIGS. 7A and 7B. Sockets 64 also have a base 104 for retention inside recesses 63 of cathode mounting flange 50, and a groove 108 for an o-ring 66 for improved pin retention. Two perpendicular longitudinal radial saw cuts 112 provide the required increased flexibility for lock pin insertion and extraction. The socket may be made of nylon which is an electrical insulator whereby the dark space shield is electrically floating relative to the cathode.

In summary, a rotatable magnetron cathode with a dark space shield attached at a supported end of the cathode and rotatable therewith has been described. Such an arrangement allows improved control of the gap between the cathode and the dark space shield. The shape of the shield also retards spalling off of the deposited material built-up on the shield. As noted, such a shield can be used for a cantilever mounted cathode at the drive end of the cathode. The shield can also be used for either end, or both, of a cathode supported at both ends. The cathode can be mounted horizontally, vertically, or at any other angle.

The present invention has been described in terms of a preferred embodiment. The invention, however, is not limited to the embodiment depicted and described. Rather, the scope of the invention is defined by the appended claims.

What is claimed is:

1. A magnetron cathode apparatus, comprising:
   a rotatable magnetron cathode having at least one supported end capable of being attached to a spindle;
   a dark space shield attached to said cathode to rotate therewith and surrounding said cathode at at least one said supported end; and
   means for attaching said dark space shield to said cathode without electrical conduction between said dark space shield and said cathode.

2. The apparatus of claim 1 wherein said means for attaching said dark space shield to said cathode comprises a lock pin and a socket, and at least one of said lock pin and said socket is electrically insulating.

3. The apparatus of claim 2 further comprising a standoff insulator for positioning said dark space shield relative to said cathode.

4. The apparatus of claim 1 wherein said dark space shield has a generally triangular cross section near a base thereof.

5. The apparatus of claim 4 wherein said dark space shield has a generally cylindrical portion extending away from said base toward an opposite end of said cathode.

6. The apparatus of claim 5 wherein said dark space shield has edges exposed to sputtered material and said edges are rounded.

7. The apparatus of claim 6 wherein said means for attaching said dark space shield to said cathode comprises a lock pin and a socket, and at least one of said lock pin and said socket is insulating.

8. The apparatus of claim 7 wherein said lock pin has a tapered end and a neck, and said socket has a matching bore for engaging said neck.

9. The apparatus of claim 8 wherein said socket has a plurality of longitudinal radial cuts through said matching bore for increased flexibility.

10. The apparatus of claim 9 further comprising an o-ring surrounding said socket and wherein said socket has a groove for holding said o-ring.

11. The apparatus of claim 7 further comprising a standoff insulator for positioning said dark space shield relative to said cathode.

12. A rotatable magnetron apparatus, comprising:
   at least one spindle with an end thereof extending into an evacuable chamber;
   a cathode attached at a supported end thereof to said end of said spindle to rotate therewith;
   a dark space shield attached to said cathode to rotate therewith and surrounding said cathode at at least one said supported end; and
   means for attaching said dark space shield to said cathode without electrical conduction between said dark space shield and said cathode.

13. The apparatus of claim 12 wherein said means for attaching said dark space shield to said cathode comprises a lock pin and a socket, and at least one of said lock pin and said socket is insulating.

14. The apparatus of claim 13 further comprising a standoff insulator for positioning said dark space shield relative to said cathode.

15. The apparatus of claim 12 wherein said dark space shield has a generally triangular cross section near a base thereof.

16. The apparatus of claim 15 wherein said dark space shield is generally cylindrical opposite said base.

17. The apparatus of claim 16 wherein said dark space shield has edges exposed to sputtered material and said edges are rounded.

18. The apparatus of claim 17 wherein said means for attaching said dark space shield to said cathode comprises a lock pin and a socket, and at least one of said lock pin and said socket is insulating.

19. The apparatus of claim 18 wherein said lock pin has a tapered end and a neck, and said socket has a matching bore for engaging said neck.

20. The apparatus of claim 19 wherein said socket has a plurality of longitudinal radial cuts through said matching bore for increased flexibility.

21. The apparatus of claim 20 further comprising an o-ring surrounding said socket and wherein said socket has a groove for holding said o-ring.

22. The apparatus of claim 18 further comprising a standoff insulator for positioning said dark space shield relative to said cathode.

\* \* \* \* \*

UNITED STATES PATENT AND TRADEMARK OFFICE
CERTIFICATE OF CORRECTION

PATENT NO. : 5,539,272
DATED : 7/23/96
INVENTOR(S) : Taylor et al.

It is certified that error appears in the above-identified patent and that said Letters Patent is hereby corrected as shown below:

Title sheet, at References Cited, U.S. PATENT DOCUMENTS, insert --5,108,574  4/28/92  Kirs et al.  204/298.22 --.

Signed and Sealed this

Twenty-seventh Day of October, 1998

Attest:

BRUCE LEHMAN

Attesting Officer

Commissioner of Patents and Trademarks